(12) United States Patent
Yamada

(10) Patent No.: US 11,802,885 B2
(45) Date of Patent: Oct. 31, 2023

(54) SENSOR PROCESSING SYSTEM, SENSOR SYSTEM, AND SENSOR PROCESSING METHOD

(71) Applicant: PANASONIC INTELLECTUAL PROPERTY MANAGEMENT CO., LTD., Osaka (JP)

(72) Inventor: Kouhei Yamada, Fukui (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 376 days.

(21) Appl. No.: 16/862,210

(22) Filed: Apr. 29, 2020

(65) Prior Publication Data

US 2020/0348328 A1    Nov. 5, 2020

Related U.S. Application Data

(60) Provisional application No. 62/841,086, filed on Apr. 30, 2019.

(51) Int. Cl.
    *G01P 3/48*     (2006.01)
    *G01R 23/00*    (2006.01)

(52) U.S. Cl.
    CPC .......... *G01P 3/4802* (2013.01); *G01R 23/005* (2013.01)

(58) Field of Classification Search
    CPC . G01P 15/0802; G01P 3/4802; G01R 23/005; G01R 1/00; G01R 3/00; G01R 5/00; G01R 7/00; G01R 9/00; G01R 11/00; G01R 13/00; G01R 15/00; G01R 17/00; G01R 19/00; G01R 21/00; G01R 22/00; G01R 23/00; G01R 25/00; G01R 27/00; G01R 29/00; G01R 31/00; G01R 33/00; G01R 35/00
    See application file for complete search history.

(56) References Cited

U.S. PATENT DOCUMENTS 6,532,429 B1 * 3/2003 Brinks ............... G05B 23/0235
                                                73/1.88
2012/0262155 A1 * 10/2012 Donovan ................ G01P 3/487
                                                324/207.2

(Continued)

FOREIGN PATENT DOCUMENTS

JP      2003-289692 A    10/2003
JP      2007-245898 A     9/2007

(Continued)

OTHER PUBLICATIONS

Notice of Reasons for Refusal dated Jun. 6, 2023 issued in the corresponding Japanese Patent Application No. 2020-078598, with English translation.

*Primary Examiner* — Feba Pothen
*Assistant Examiner* — Brent J Andrews
(74) *Attorney, Agent, or Firm* — McDermott Will & Emery LLP

(57) ABSTRACT

A sensor processing system includes a plurality of reduction circuits. The plurality of reduction circuits correspond to a plurality of sensors on a one-to-one basis. Each of the plurality of reduction circuits is electrically connected to an output terminal of a corresponding one of the plurality of sensors to reduce a low-frequency component of a sensor output of the corresponding one of the plurality of sensors.

13 Claims, 5 Drawing Sheets

(56) References Cited

U.S. PATENT DOCUMENTS

| | | | |
|---|---|---|---|
| 2016/0025820 A1* | 1/2016 | Scheller | G01P 3/487 |
| | | | 324/207.25 |
| 2016/0341760 A1 | 11/2016 | Kuroda et al. | |
| 2017/0030715 A1 | 2/2017 | Song et al. | |
| 2017/0108536 A1* | 4/2017 | Hebiguchi | G01R 15/08 |
| 2017/0336438 A1* | 11/2017 | Kuroda | G01C 19/5614 |

FOREIGN PATENT DOCUMENTS

| | | |
|---|---|---|
| JP | 2011-169672 A | 9/2011 |
| JP | 2017-502271 A | 1/2017 |
| WO | 2015/128922 A1 | 9/2015 |

\* cited by examiner

SENSOR PROCESSING SYSTEM, SENSOR SYSTEM, AND SENSOR PROCESSING METHOD

CROSS-REFERENCE TO RELATED APPLICATIONS

The present application is based upon and claims the benefit of priority of U.S. Provisional Application No. 62/841,086, filed on Apr. 30, 2019, the entire contents of which are incorporated herein by reference.

TECHNICAL FIELD

The present disclosure relates generally to sensor processing systems, sensor systems, and sensor process methods, and specifically, to a sensor processing system based on outputs of a plurality of sensors, a sensor system including the sensor processing system, and a sensor process method based on outputs of a plurality of sensors.

BACKGROUND ART

WO 2015/128922 A1 (hereinafter referred to as "Patent Literature 1") discloses a detection device (sensor processing system) including a sensor section (sensor) and a control circuit. The detection device described in Patent Literature 1 detects a prescribed physical quantity based on a detection result by the sensor unit.

The detection device described in Patent Literature 1 can detect a relatively large change in sensitivity due to a disconnection failure or the like, but it is difficult for the detection device described in Patent Literature 1 to detect a relatively small change in sensitivity.

SUMMARY

In view of the foregoing, it is an object of the present disclosure to provide a sensor processing system, a sensor system, and a sensor process method that allow easy increases in fault detection accuracy of a sensor and detection accuracy of the sensor.

A sensor processing system according to one aspect of the present disclosure includes a plurality of reduction circuits. The plurality of reduction circuits corresponds to a plurality of sensors on a one-to-one basis. Each of the plurality of reduction circuits is electrically connected to an output terminal of a corresponding one of the plurality of sensors to reduce a low-frequency component of a sensor output of the corresponding one of the plurality of sensors.

A sensor system according to one aspect of the present disclosure includes the sensor processing system and the plurality of sensors.

A sensor process method according to one aspect of the present disclosure includes individually reducing low-frequency components of outputs of a plurality of sensors.

BRIEF DESCRIPTION OF THE DRAWINGS

The figures depict one or more implementation in accordance with the present teaching, by way of example only, not by way of limitations. In the figures, like reference numerals refer to the same or similar elements.

DETAILED DESCRIPTION

Figure 1:
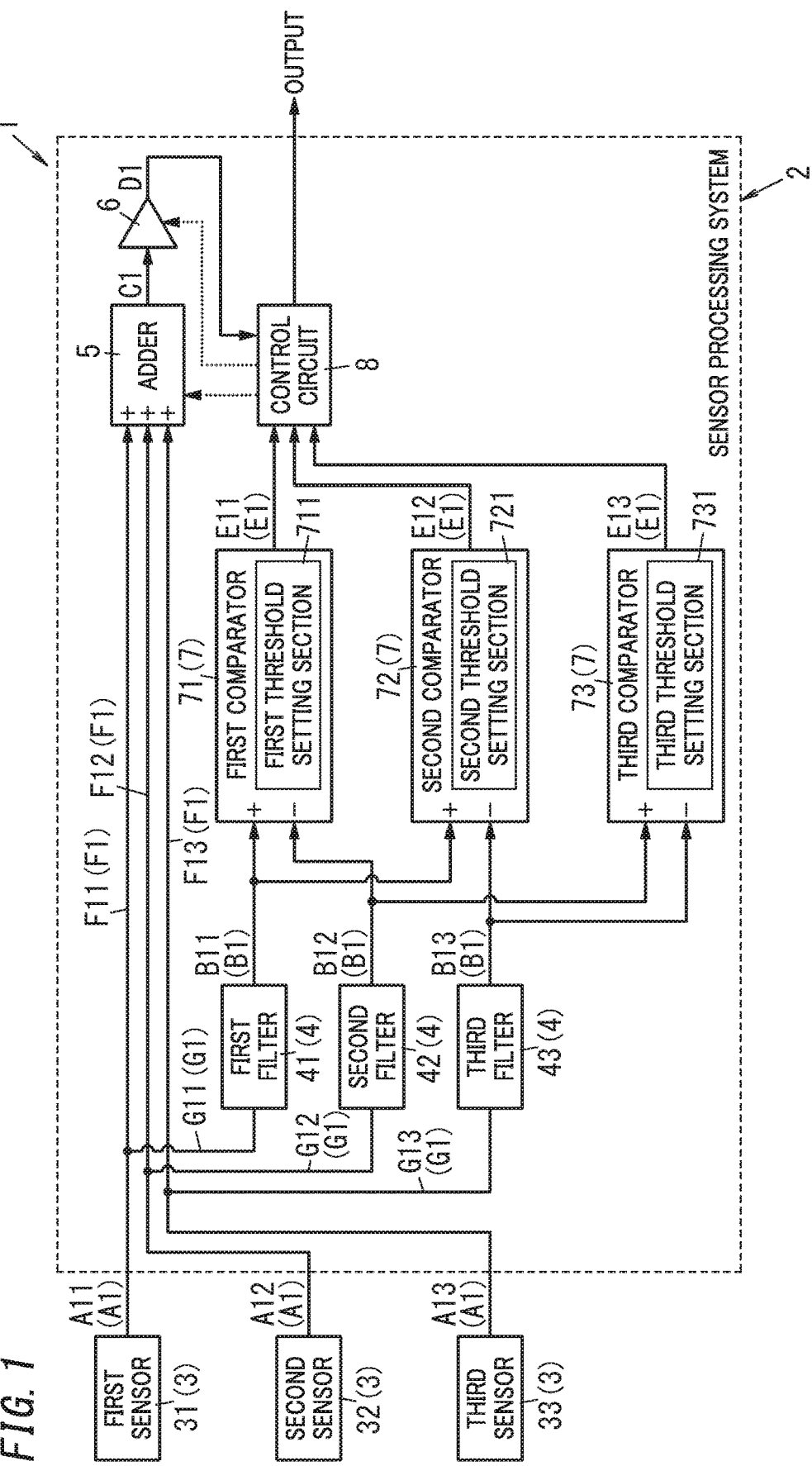
FIG. 1 is a block diagram illustrating a sensor system according to a first embodiment.

Sensor systems according to first and second embodiments will be described below by referring to the drawings. Each drawing referred to in the embodiments and the like below is a schematic view, and size and thickness ratios of each component in the drawing do not necessarily reflect the actual dimensional ratios.

First Embodiment (1) Sensor System

A configuration of a sensor system 1 according to the first embodiment will be described by referring to FIG. 1.

As illustrated in FIG. 1, the sensor system 1 includes a sensor processing system 2 and a plurality of (in the illustrated example, three) sensors 3.

The sensor system 1 is used, for example, by being mounted on a vehicle such as an automobile or a self-operating robot. For example, the sensor system 1 is used in a control system of a vehicle. The plurality of sensors 3 are attached to a vehicle, and the plurality of sensors 3 detect prescribed physical quantities, and thereby, the sensor system 1 correctly recognizes the location, orientation, and inclination of the vehicle based on detection results by the plurality of sensors 3. The sensor system 1 is used, for example, together with other self-driving modules or devices for self-driving vehicles.

(2) Components of Sensor System

Components of the sensor system 1 will be described hereinafter by referring to the drawings.

(2.1) Sensor

As illustrated in FIG. 1, the plurality of sensors 3 include a first sensor 31, a second sensor 32, and a third sensor 33. Each of the plurality of sensors 3 is, for example, an inertial sensor, detects a prescribed physical quantity, and outputs a detection result as a sensor output A1 (sensor signal).

The prescribed physical quantity is, for example, an angular rate, angular acceleration, speed, acceleration, vibration, load, atmospheric pressure, electromagnetic quantity, temperature, or the like. When the prescribed physical quantity is the angular velocity, each sensor 3 is an angular rate sensor. When the prescribed physical quantity is acceleration, each sensor 3 is an acceleration sensor.

The plurality of sensors 3 are used, for example, to detect the same physical quantities. In other words, the first sensor 31, the second sensor 32, and the third sensor all detect the same physical quantities. This enables redundancy to be improved. For example, even if the first sensor 31 breaks down, the second sensor 32 and the third sensor can detect the physical quantities. In short, even if at least two of the first sensor 31, the second sensor 32, or the third sensor 33 break down, the remaining sensor 3 can detect the physical quantity.

(2.2) Sensor Processing System

As illustrated in FIG. 1, the sensor processing system 2 includes a plurality of (in the illustrated example, three)

filters 4 (reduction circuits), an adder 5, a divider 6, a plurality of (in the illustrated example, three) comparators 7, and a control circuit 8.

(2.2.1) Filter

As illustrated in FIG. 1, the plurality of filters 4 correspond to the plurality of sensors 3 on a one-to-one basis and are each inserted into an output path of a corresponding one of the plurality of sensors 3. Each of the plurality of filters 4 is connected to an output terminal of the corresponding one of the plurality of sensors 3. Specifically, the plurality of filters 4 include a first filter 41, a second filter 42, and a third filter 43. The first filter 41 corresponds to the first sensor 31 and is inserted into a first path G11 of the first sensor 31. The first path G11 is a path between the first sensor 31 and the comparator 7. In the example of FIG. 1, the first path G11 branches from a first output path F1 between the first sensor 31 and the adder 5. The second filter 42 corresponds to the second sensor 32 and is inserted into a second path G12 of the second sensor 32. The second path G12 is a path between the second sensor 32 and the comparator 7. In the example of FIG. 1, the second path G12 branches from a second output path F12 between the second sensor 32 and the adder 5. The third filter 43 corresponds to the third sensor 33 and is inserted into a third path G13 of the third sensor 33. The third path G13 is a path between the third sensor 33 and the comparator 7, and in the example of FIG. 1, the third path G13 branches from a third output path F13 between the third sensor 33 and the adder 5.

Each of the plurality of filters 4 reduces a low-frequency component of the sensor output A1 of the corresponding one of the sensors 3. Here, the "low-frequency component of a sensor output" means a frequency component lower than the frequency of a variation component when a detection target of the sensor 3 is detected. The "low-frequency component of a sensor output" includes a direct current component (DC component) of the sensor output A1.

In the embodiment, the plurality of filters 4 are high-pass filters. Each filter 4 removes the direct current component of the sensor output A1. Note that the plurality of filters 4 are not limited to the high-pass filters but may be other filters. The plurality of filters 4 may be, for example, bandpass filters.

For example, the first filter 41 reduces (removes) a low-frequency component of a first sensor output A11 of the first sensor 31. The sensor output from which the low-frequency component has been reduced (removed) by the first filter 41 is output as a first filter output B11 from the first filter 41. The second filter 42 reduces (removes) a low-frequency component of a second sensor output A12 of the second sensor 32. The sensor output from which the low-frequency component has been reduced (removed) by the second filter 42 is output as a second filter output B12 from the second filter 42. The third filter 43 reduces (removes) a low-frequency component of a third sensor output A13 of the third sensor 33. The sensor output from which the low-frequency component has been reduced (removed) by the third filter 43 is output as a third filter output B13 from the third filter 43.

As described above, each of the plurality of filters 4 reduces (removes) the direct current component of the sensor output A1 of the corresponding one of the sensors 3. The sensor output, from which the direct current component has been reduced (removed), is output as a filter output B1 from each filter 4. Thus, when each sensor 3 is, for example, an angular rate sensor, each sensor 3 enables a reduction of the sensor output A1 in a state where an angular rate is not input. That is, biasing errors of each sensor 3 can be reduced.

(2.2.2) Adder

As illustrated in FIG. 1, the adder 5 adds up the sensor outputs A1 of the plurality of sensors 3. Specifically, the adder 5 adds up the first sensor output A11 of the first sensor 31, the second sensor output A12 of the second sensor 32, and the third sensor output A13 of the third sensor 33.

The adder 5 outputs an addition result obtained by adding up the sensor outputs A1 of the plurality of sensors 3. For example, the adder 5 outputs the addition result to the control circuit 8. In the example of FIG. 1, the adder 5 outputs the addition result to the control circuit 8 via the divider 6.

Adding up the sensor outputs A1 of the plurality of sensors 3 by the adder 5 as described above enhances the accuracy of a detection result by sensors 3 more easily than in a case where only a sensor output of one sensor is used.

When the sensor outputs A1 of the plurality of sensors 3 are used, the angle random walk (ARW) is lowered. This will be described in detail below. Here, the case of three sensor outputs A1 will be described.

The first sensor output A11 of the first sensor 31 is normally distributed with an average value $\mu 1$ and a variance $\sigma 1$. Similarly, the second sensor output A12 of the second sensor 32 is normally distributed with an average value $\mu 2$ and a variance $\sigma 2$. Similarly, the third sensor output A13 of the third sensor 33 is normally distributed with an average value $\mu 3$ and a variance $\sigma 3$. The sensitivity of each sensor 3 is denoted by T.

When only the first sensor output A11 of the first sensor 31 is used, the sensitivity is T and the variance is $\sigma 1$, and therefore, the S/N ratio is a value obtained by dividing the sensitivity T by the variance $\sigma 1$, that is, sensitivity T/variance $\sigma 1$.

In contrast, when the first sensor output A11 of the first sensor 31 and the second sensor output A12 of the second sensor 32 are used, the sensitivity is 2T. When the normal distribution of the first sensor output A11 and the normal distribution of the second sensor output A12 are superimposed, a normal distribution with an average value $(\mu 1+\mu 2)$ and a variance $(\sigma 1^2+\sigma 2^2)^{1/2}$ is obtained. Thus, the S/N ratio is a value obtained by dividing the sensitivity 2T by the variance $(\sigma 1^2+\sigma 2^2)^{1/2}$, that is, sensitivity 2T/variance $(\sigma 1^2+\sigma 2^2)^{1/2}$.

When the variance $\sigma 1$ and the variance $\sigma 2$ are equal to each other, the variance in the case of two sensor outputs A1 is $\frac{1}{2}^{1/2}$ times the variance in the case of one sensor output A1. The S/N ratio is $2^{1/2}$T/$\sigma 1$.

When the first sensor output A11 of the first sensor 31, the second sensor output A12 of the second sensor 32, and the third sensor output A13 of the third sensor 33 are used, the sensitivity is 3T. When the normal distribution of the first sensor output A11, the normal distribution of the second sensor output A12, and the normal distribution of the third sensor output A13 are superimposed, a normal distribution with an average value $(\mu 1+\mu 2+\mu 3)$ and a variance $(\sigma 1^2+\sigma 2^2+\sigma 3^2)^{1/2}$ is obtained. Thus, the S/N ratio is a value obtained by dividing the sensitivity 3T by the variance $(\sigma 1^2+\sigma 2^2+\sigma 3^2)^{1/2}$, that is, sensitivity 3T/variance $(\sigma 1^2+\sigma 2^2+\sigma 3^2)^{1/2}$.

When the variance of $\sigma 1$, the variance of $\sigma 2$, and the variance of $\sigma 3$ are equal to one another, the variance in the case of three sensor outputs A1 is $\frac{1}{3}^{1/2}$ times the variance in the case of one sensor output A1. The S/N ratio is $3^{1/2}$T/$\sigma 1$.

As described above, when all the variances of the sensors 3 are equal to one another, the variance in the case of a plurality of sensors 3 is inversely proportional to a square root of the number of sensors 3, that is, the number of sensor outputs A1. The S/N ratio is proportional to a square root of the number of sensors 3, that is, the number of sensor outputs A1.

Figure 2:
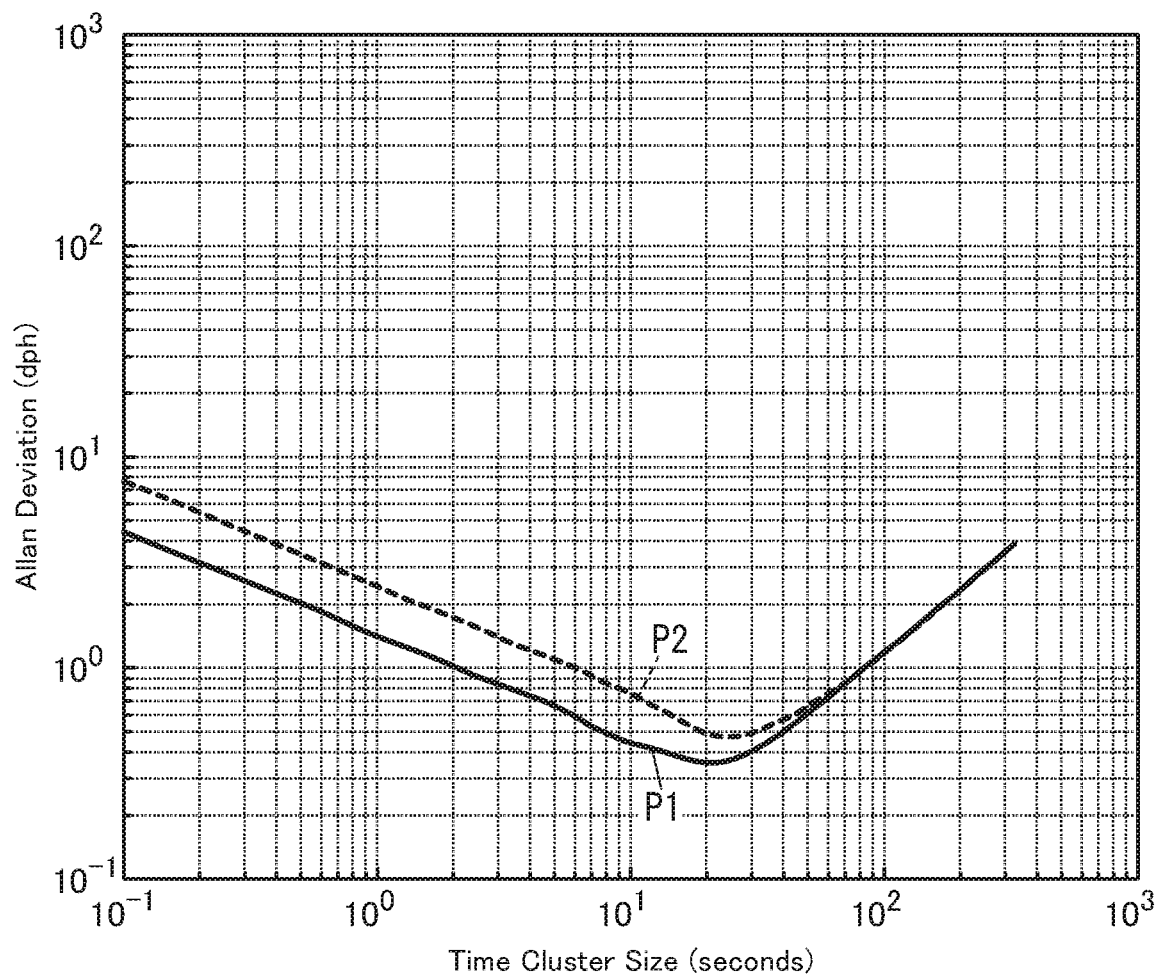
FIG. 2 is an output characteristic diagram of an adder in the sensor system.

As shown in FIG. 2, a property P1 when sensor outputs A1 of three sensors 3 are added up has a lower Allan Variance than a property P2 of only a sensor output of one sensor. Moreover, BIAS instability (BI) is also improved.

The adder 5 has a function of setting individual contribution factors for the plurality of sensors 3. Specifically, the adder 5 may add up the plurality of sensor outputs A1 with the same contribution factor, or may add up the plurality of sensor outputs A1 with different contribution factors. For example, in an initial state, the contribution factor coefficients of all the sensors 3 are set to 1, and the contribution factor coefficient of an anomalous sensor 3 (broken sensor 3) is set to be lower than 1 or set to 0. This makes it possible to reduce the influence of a sensor output A1 of the anomalous sensor 3 in the output of the addition result (hereinafter referred to as an "addition output C1").

(2.2.3) Divider

As described above, since the adder 5 adds up the sensor outputs A1 of the plurality of sensors 3, the amplitude of the addition output C1 from the adder 5 varies depending on the number of sensor outputs A1 input to the adder 5. As the number of sensor outputs A1 input to the adder 5 increases, the amplitude of the addition output C1 increases. If such an addition output C1 is input to the control circuit 8 as it is, the control circuit 8 may erroneously recognize the addition output C1. For this reason, the amplitude of an addition output D1 input to the control circuit 8 has to fall within a prescribed range regardless of the number of sensor outputs A1 input to the adder 5.

Therefore, as illustrated in FIG. 1, the divider 6 reduces the amplitude of the addition output C1 of the adder 5. Specifically, the gain of the divider 6 is, for example, the inverse number of the number of sensor outputs A1 input to the adder 5. The divider 6 multiplies the amplitude of the addition output C1 by the inverse number of the number of sensor outputs A1 input to the adder 5. For example, when three sensor outputs A1 are input to the adder 5, the amplitude of the addition output C1 of the adder 5 is three times that in the case of inputting only one sensor output to the adder 5. Therefore, the divider 6 divides the amplitude of the addition output C1 of the adder 5 by three. This enables the range of the addition output C1 to be a prescribed range regardless of the number of sensor outputs A1 input to the adder 5. The addition output D1 amplified by the divider 6 is output to the control circuit 8.

Note that the gain of the divider 6 is not limited to the inverse number of the number of sensor outputs A1 input to the adder 5 but may be other than the above-described example. In short, the gain of the divider 6 is set at least such that a change in the amplitude of the addition output D1 input to the control circuit 8 is small even if the number of sensor outputs A1 input to the adder 5 changes.

(2.2.4) Comparator

As illustrated in FIG. 1, each of the plurality of comparators 7 compares the filter outputs B1 of two of the plurality of filters 4. Then, each comparator 7 outputs a comparison result E1. The plurality of comparators 7 include a first comparator 71, a second comparator 72, and a third comparator 73.

The first comparator 71 compares the first filter output B11 of the first filter 41 and the second filter output B12 of the second filter 42 with each other. Then, the first comparator 71 outputs a comparison result between the first filter output B11 and the second filter output B12 as a first comparison result E11.

Specifically, the first comparator 71 receives the first filter output B11 of the first filter 41 and the second filter output B12 of the second filter 42. The first comparator 71 has a non-inverted input terminal (indicated by a "+" symbol in FIG. 1) to which the first filter output B11 is input. The first comparator 71 has an inverted input terminal (indicated by a "−" symbol in FIG. 1) to which the second filter output B12 is input. The first comparator 71 compares the first filter output B11 and the second filter output B12 with each other and outputs "0" as the first comparison result E11 if the first filter output B11 and the second filter output B12 are the same. In contrast, if the first filter output B11 differs from the second filter output B12, the first comparator 71 outputs "1" as the first comparison result E11. The first comparator 71 outputs the first comparison result E11 to the control circuit 8.

The first comparator 71 includes a first threshold setting section 711. The first threshold setting section 711 sets a first threshold to be compared with the absolute value of a difference between the first filter output B11 and the second filter output B12. In the example described above, the first threshold is 0.

Note that the first threshold setting section 711 may set the first threshold to a value larger than 0. Even when the first threshold is larger than 0, if the absolute value of the difference between the first filter output B11 and the second filter output B12 is equal to or smaller than the first threshold, the first comparator 71 outputs "0" as the first comparison result E11. If the absolute value of the difference between the first filter output B11 and the second filter output B12 is larger than the first threshold, the first comparator 71 outputs "1" as the first comparison result E11.

The second comparator 72 compares the first filter output B11 of the first filter 41 and the third filter output B13 of the third filter 43 with each other. Then, the second comparator 72 outputs a comparison result between the first filter output B11 and the third filter output B13 as a second comparison result E12.

Specifically, the second comparator 72 receives the first filter output B11 of the first filter 41 and the third filter output B13 of the third filter 43. The second comparator 72 has a non-inverted input terminal (indicated by a "+" symbol in FIG. 1) to which the first filter output B11 is input. The second comparator 72 has an inverted input terminal (indicated by a "−" symbol in FIG. 1) to which the third filter output B13 is input. The second comparator 72 compares the first filter output B11 and the third filter output B13 with each other and outputs "0" as the second comparison result E12 if the first filter output B11 and the third filter output B13 are the same. In contrast, if the first filter output B11 differs from the third filter output B13, the second comparator 72 outputs "1" as the second comparison result E12. The second comparator 72 outputs the second comparison result E12 to the control circuit 8.

The second comparator 72 has a second threshold setting section 721. The second threshold setting section 721 sets a second threshold to be compared with the absolute value of a difference between the first filter output B11 and the third filter output B13. In the example described above, the second threshold is 0.

Note that the second threshold setting section 721 may set the second threshold to a value larger than 0. Even when the second threshold is larger than 0, if the absolute value of the difference between the first filter output B11 and the third filter output B13 is equal to or smaller than the second threshold, the second comparator 72 outputs "0" as the second comparison result E12. If the absolute value of the difference between the first filter output B11 and the third filter output B13 is larger than the second threshold, the second comparator 72 outputs "1" as the second comparison result E12.

The third comparator 73 compares the second filter output B12 of the second filter 42 and the third filter output B13 of the third filter 43 with each other. The third comparator 73 outputs a comparison result between the second filter output B12 and the third filter output B13 as a third comparison result E13.

Specifically, the third comparator 73 receives the second filter output B12 of the second filter 42 and the third filter output B13 of the third filter 43. The third comparator 73 has a non-inverted input terminal (indicated by a "+" symbol in FIG. 1) to which the second filter output B12 is input. The third comparator 73 has an inverted input terminal (indicated by a "−" symbol in FIG. 1) to which the third filter output B13 is input. The third comparator 73 compares the second filter output B12 and the third filter output B13 with each other and outputs "0" as the third comparison result E13 if the second filter output B12 and the third filter output B13 are the same. In contrast, if the second filter output B12 differs from the third filter output B13, the third comparator 73 outputs "1" as the third comparison result E13. The third comparator 73 outputs the third comparison result E13 to the control circuit 8.

The third comparator 73 has a third threshold setting section 731. The third threshold setting section 731 sets a third threshold to be compared with the absolute value of the difference between the second filter output B12 and the third filter output B13. In the example described above, the third threshold is 0.

Note that the third threshold setting section 731 may set the third threshold to a value larger than 0. Even when the third threshold is larger than 0, if the absolute value of the difference between the second filter output B12 and the third filter output B13 is equal to or smaller than the third threshold, the third comparator 73 outputs "0" as the third comparison result E13. If the absolute value of the difference between the second filter output B12 and the third filter output B13 is larger than the third threshold, the third comparator 73 outputs "1" as the third comparison result E13.

(2.2.5) Control Circuit

As illustrated in FIG. 1, the control circuit 8 obtains the addition result by the adder 5. Specifically, the control circuit 8 obtains the addition result (addition output D1) whose amplitude has been adjusted by the divider 6. Then, the control circuit 8 outputs the addition result thus obtained to, for example, an external device.

Moreover, the control circuit 8 obtains the comparison result E1 from each of the plurality of comparators 7. Specifically, the control circuit 8 obtains the first comparison result E11 from the first comparator 71, obtains the second comparison result E12 from the second comparator 72, and obtains the third comparison result E13 from the third comparator 73.

The control circuit 8 has a function of determining whether or not the plurality of sensors 3 are normal based on the comparison results E1 obtained from the plurality of comparator 7. As described above, the plurality of sensors 3 detect the same physical quantity. Therefore, if all of the plurality of sensors 3 are normal, the plurality of sensors 3 output the same sensor outputs A1. Thus, the plurality of comparators 7 compare the same filter outputs B1 (sensor outputs A1) with each other, and therefore, the plurality of comparators 7 output "0" as comparison results. In contrast, if the plurality of sensors 3 include an anomalous sensor 3, the normal sensor 3 and the anomalous sensor 3 output sensor outputs A1 different from each other. Thus, at least one of the plurality of comparators 7 compares the different filter outputs B1 (sensor outputs A1) with each other, and therefore, the at least one comparator 7 outputs "1" as a comparison result. The term "anomalous sensor" in the present disclosure means a sensor 3 with which something is wrong. The term "normal sensor" means a sensor 3 with which nothing is wrong.

For example, if the first comparison result E11 and the second comparison result E12 are "1", the filter 4 which allows the filter outputs B1 to be input to both the first comparator 71 and the second comparator 72 is the first filter 41, and the sensor 3 corresponding to the first filter 41 is the first sensor 31. Accordingly, the control circuit 8 determines that the first sensor 31 is anomalous. If the first comparison result E11 and the third comparison result E13 is "1", the filter 4 which allows the filter outputs B1 to be input to both the first comparator 71 and the third comparator 73 is the second filter 42, and the sensor 3 corresponding to the second filter 42 is the second sensor 32. Accordingly, the control circuit 8 determines that the second sensor 32 is anomalous. If the second comparison result E12 and the third comparison result E13 are "1", the filter 4 which allows the filter outputs B1 to be input to both the second comparator 72 and the third comparator 73 is the third filter 43, and the sensor 3 corresponding to the third filter 43 is the third sensor 33. Accordingly, the control circuit 8 determines that the third sensor 33 is anomalous.

As described above, when something is wrong with any of the plurality of sensors 3, it is possible to accurately specify the anomalous sensor 3.

The control circuit 8 further has a function of determining whether or not the plurality of comparators 7 are normal. As described above, each of the plurality of comparators 7 receives the filter outputs B1 of two of the plurality of filters 4. That is, the comparator 7 receives sensor outputs A1 of two of the plurality of sensors 3. In other words, each of the sensor outputs A1 of the plurality of sensors 3 (the filter outputs B1 of the plurality of filters 4) is input to the two comparators 7. Therefore, when the plurality of sensors 3 include an anomalous sensor 3, the comparison result E1 between the two comparators 7 is "1", but in no case can only the comparison result E1 of one comparator 7 be "1". Therefore, when only the comparison result E1 of one comparator 7 is "1", the control circuit 8 determines that the comparator 7 in which the comparison result E1 is "1" is anomalous. In contrast, when all the comparison results E1 of the plurality of comparators 7 are "0", the control circuit 8 determines that all the comparators 7 are normal.

For example, if only the first comparison result E11 is "1", the control circuit 8 determines that the first comparator 71 is anomalous. If only the second comparison result E12 is "1", the control circuit 8 determines that the second comparator 72 is anomalous. If only the third comparison result E13 is "1", the control circuit 8 determines that the third comparator 73 is anomalous.

Moreover, the filter outputs B1 are not input to the comparators 7, but a reference signal is input to each comparator 7, and it is possible to determine, based on the comparison result E1 at this time, whether or not the plurality of comparators 7 are anomalous. The reference signal is a combination of a first reference signal input to the non-inverted input terminal (+ terminal) of the comparator 7 and a second reference signal input to the inverted input terminal (− terminal) of the comparator 7. The first reference signal is a pulse signal that has a sequence of values "0", "1", "0". In contrast, the second reference signal is a signal that has a sequence of values "0", "0", "0". When the first reference signal and the second reference signal as described above are input to the comparator 7, if the comparison result E1 is "0", "1", "0", the control circuit 8 determines that the comparator 7 is normal. In contrast, if the comparison result E1 is other than "0", "1", "0", the control circuit 8 determines that the comparator 7 is anomalous.

The control circuit 8 further has a function of controlling the adder 5. Specifically, the control circuit 8 controls the adder 5 based on the plurality of comparison results E1 obtained from the plurality of comparators 7. More specifically, when the control circuit 8 determines an anomaly in a sensor 3, the control circuit 8 performs control of the adder 5 to as to decrease a contribution factor for the filter output B1 of the filter 4 corresponding to the anomalous sensor 3. According to the control by the control circuit 8, the adder 5 decreases the contribution factor for the filter output B1 of the filter 4 corresponding to the anomalous sensor 3 of the plurality of sensors 3. Here, "decrease a contribution factor" includes the case where the contribution factor is decreased to 0. When the contribution factor for the filter output B1 of the filter 4 corresponding to the anomalous sensor 3 is set to 0, the control circuit 8 performs control of the adder 5 so as to exclude the filter output B1 of the filter 4 corresponding to anomalous sensor 3 and add up only the filter outputs B1 of the remaining filters 4. That is, the control circuit 8 performs control of the adder 5 so as to add up only the filter outputs B1 of the filters 4 corresponding to the normal sensors 3. According to the control by the control circuit 8, the adder 5 adds up only the filter outputs B1 of the remaining filters 4 and outputs the addition result.

The control circuit 8 further has a function of controlling the divider 6. If setting of the contribution factor to the filter outputs B1 of the plurality of filters 4 is changed, such as by decreasing a contribution factor for the anomalous sensor 3, the amplitude of the addition output C1 of the adder 5 varies. Therefore, when the setting of the contribution factor to the filter outputs B1 of the plurality of filters 4 is changed, the control circuit 8 performs control of the divider 6 so as to change the gain of the divider 6 such that an amplitude level of the addition result (addition output D) to be input to the control circuit 8 is within a prescribed range.

(3) Operation of Sensor Processing System

Normal operation (sensor process method) of the sensor processing system 2 according to the first embodiment will be described below by referring to FIG. 1.

First, each of the plurality of sensors 3 outputs a sensor output A1. Thereafter, the plurality of sensor outputs A1 are output to the adder 5.

The adder 5 adds up the plurality of sensor outputs A1. At this time, the adder 5 sets contribution factors to the sensor outputs A1 of the sensors 3 and then adds up the plurality of sensor outputs A1 (outputs after the contribution factors are set), and outputs the addition result (addition output C1). Thereafter, the divider 6 adjusts the amplitude of the addition output C1 of the adder 5. The divider 6 adjusts the amplitude of the addition output C1 such that the amplitude of the addition output D1 to be input to the control circuit 8 is substantially constant regardless of the number of sensor outputs A1 input to the adder 5. Thereafter, the control circuit 8 obtains the addition output D1 adjusted by the divider 6.

Figure 3:
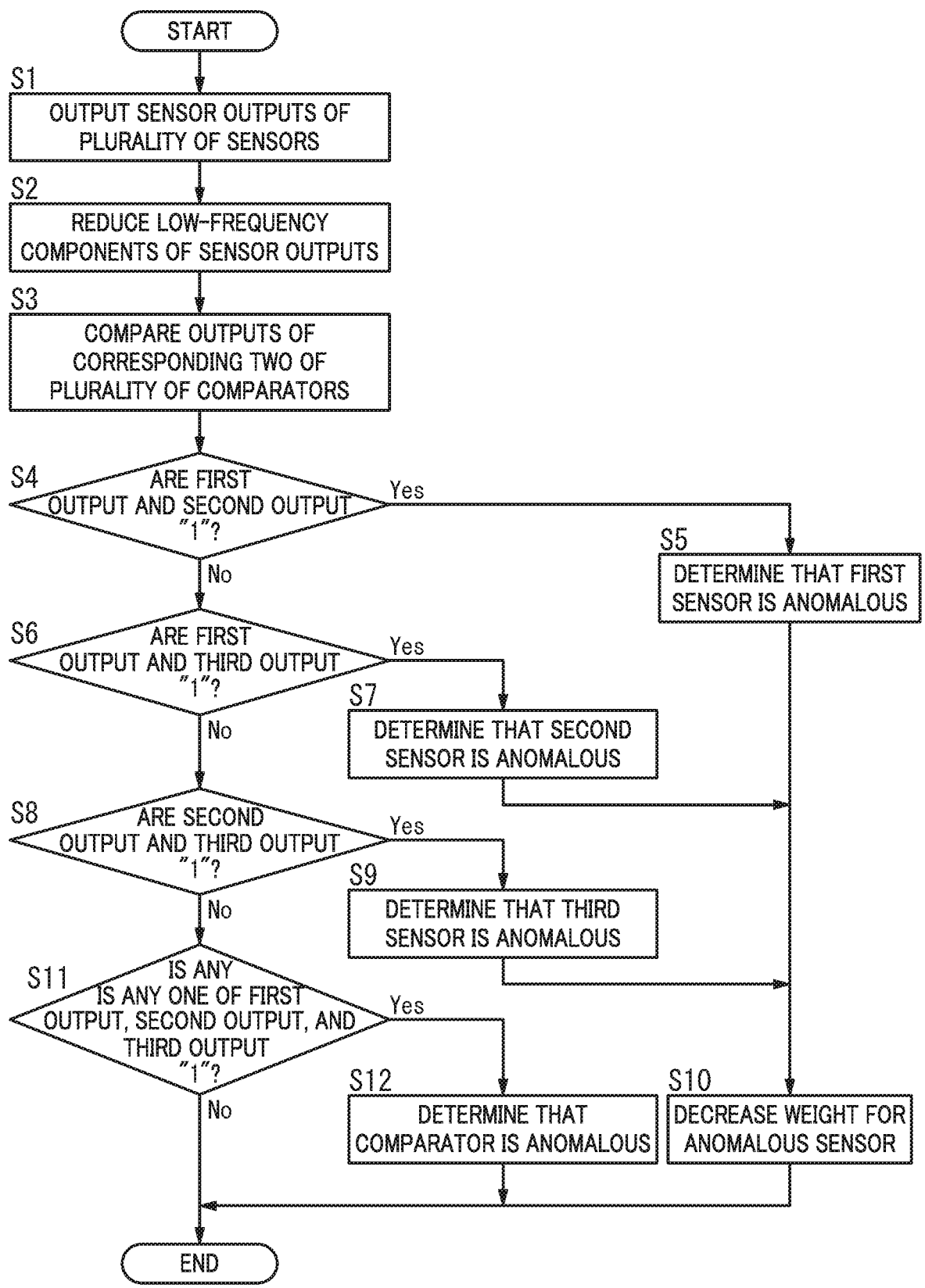
FIG. 3 is a flow chart illustrating operation of the sensor system.

Next, operation of determining anomalies (sensor process method) in the sensor processing system 2 will be described with reference to FIGS. 1 and 3.

In step S, each of the plurality of sensors 3 outputs a sensor output A1. Thereafter, in step S2, the plurality of filters 4 individually reduce (remove) the low-frequency components of the sensor outputs A1 of the plurality of sensors 3. That is, each filter 4 reduces (removes) the low-frequency component of the sensor output A1 of a corresponding one of the sensors 3. Then, in step S3, the filter outputs B1 (sensor outputs A1) of corresponding two of the plurality of comparators 7 are compared with each other.

In step S4, the control circuit 8 determines whether or not the first comparison result E11 ("first output" in FIG. 3) and the second comparison result E12 ("second output" in FIG. 3) are "1". If at least one of the first comparison result E11 or the second comparison result E12 is not "1" ("No" in step S4), the process proceeds to step S6. On the other hand, if the first comparison result E11 and the second comparison result E12 are "1" ("Yes" in step S4), the control circuit 8 determines that the first sensor 31 is anomalous (step S5).

In step S6, the control circuit 8 determines whether or not the first comparison result E11 ("first output" in FIG. 3) and the third comparison result E13 ("third output" in FIG. 3) are "1". If at least one of the first comparison result E11 or the third comparison result E13 is not "1" ("No" in step S6), the process proceeds to step S8. In contrast, if the first comparison result E11 and the third comparison result E13 are "1" ("Yes" in step S6), the control circuit 8 determines that the second sensor 32 is anomalous (step S7).

In step S8, the control circuit 8 determines whether or not the second comparison result E12 ("second output" in FIG. 3) and the third comparison result E13 ("third output" in FIG. 3) are "1". If at least one of the second comparison result E12 or the third comparison result E13 is not "1" ("No" in step S8), the process proceeds to step S11. In contrast, if the second comparison result E12 and the third comparison result E13 are "1" ("Yes" in step S8), the control circuit 8 determines that the third sensor 33 is anomalous (step S9).

In step S10, if it is determined in step S5 that the first sensor 31 is anomalous, if it is determined in step S7 that the second sensor 32 is anomalous, or if it is determined step S9 that the third sensor 33 is anomalous, the control circuit 8 decreases a contribution factor for the anomalous sensor 3.

Thereafter, in step S11, the control circuit 8 determines whether any one of the first comparison result E11 ("first output" in FIG. 3), the second comparison result E12 ("second output" in FIG. 3), and the third comparison result E13 ("third output" in FIG. 3) is "1". If any one of the first comparison result E11, the second comparison result E12, and the third comparison result E13 is "1" ("Yes" in step S1), the control circuit 8 determines that any one of the plurality of comparators 7 is anomalous (step S12). In contrast, if only one of the first comparison result E11, the second comparison result E12, and the third comparison result E13 is not "1" ("No" in step S1), the control circuit 8 determines that the plurality of comparators 7 are normal.

(4) Effect

In the sensor processing system 2 according to the first embodiment, each of the plurality of filters 4 (reduction circuits) corresponding to the plurality of sensors 3 on a one-to-one basis reduces the low-frequency component of the sensor output A1 of the corresponding one of the plurality of sensor 3. This enables the low-frequency components of the sensor outputs A1 of the plurality of sensors 3 to be individually reduced, and therefore, it is easy to enhance fault detection accuracy of the sensor 3 and detection accuracy of the sensor 3.

In the sensor processing system 2 according to the first embodiment, the plurality of sensors 3 are angular rate sensors. Thus, it is easy to enhance the detection accuracy with respect to the angular rate.

In the sensor processing system 2 according to the first embodiment, the plurality of sensors 3 are acceleration sensors. Thus, it is easy to enhance the detection accuracy with respect to the acceleration.

In the sensor processing system 2 according to the first embodiment, each of the plurality of filters 4 (reduction circuits) is branched from an output path F1 of the corresponding one of the plurality of sensors 3. Therefore, it is possible to output, via the output path F1, a result based on the sensor outputs A1, whose low-frequency components have not been reduced.

In the sensor processing system 2 according to the first embodiment, the adder 5 adds up the sensor outputs A1 of the plurality of sensors 3 and outputs the addition result. This makes it possible to detect a detection target by adding up the sensor outputs A1 of the plurality of sensors 3. Therefore, it is easy to enhance fault detection accuracy of the sensor 3 and detection accuracy of the sensor 3 as compared with detecting a detection target by using one sensor output.

In the sensor processing system 2 according to the first embodiment determines whether or not the sensors 3 are normal based on the filter outputs B1 of two of the plurality of filters 4 (reduction circuits), that is, the comparison result E1 of comparison between the two sensor outputs A1 of the plurality of sensors 3. Thus, the states of the sensors 3 can be determined by effectively utilizing the sensor outputs A1 of the plurality of sensors 3.

In the sensor processing system 2 according to the first embodiment, the adder 5 sets individual contribution factors for the plurality of sensors 3. Thus, for example, the sensor outputs A1 of the plurality of sensors 3 can be added up in a state where a contribution factor for the anomalous sensor 3 is decreased. As a result, the fault detection accuracy of the sensor 3 and the detection accuracy of the sensor 3 can be further enhanced.

In the sensor processing system 2 according to the first embodiment, whether the sensors 3 are normal is determined based on the comparison result E1 obtained by comparing the filter outputs B1 of two of the plurality of filters 4 (reduction circuits), that is, the sensor outputs A1 of two of the plurality of sensors 3 with each other, and the contribution factor for the anomalous sensor 3 is decreased. This enables the filter outputs B1 of the plurality of filters 4 to be added up in a state where the contribution factor for the anomalous sensor 3 is decreased. Therefore, the fault detection accuracy of the sensor 3 and the detection accuracy of the sensor 3 can be further enhanced.

In the sensor processing system 2 according to the first embodiment, the plurality of filters 4 (reduction circuits) are high-pass filters. This enables the low-frequency components of the sensor outputs A1 to be reliably reduced.

Second Embodiment

Figure 4:
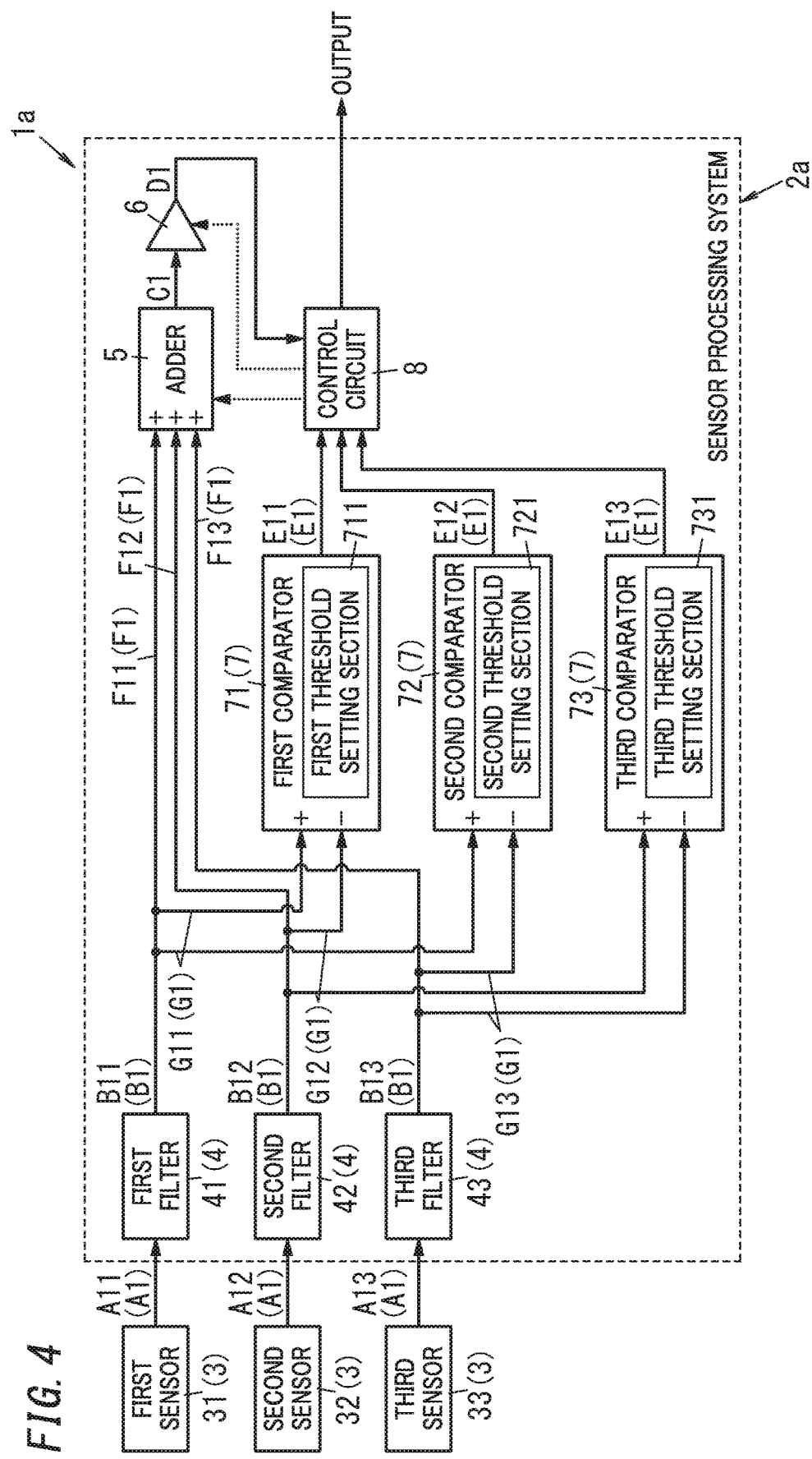
FIG. 4 is a block diagram illustrating a sensor system according to a second embodiment.

A sensor system 1a according to a second embodiment is different from the sensor system 1 (see FIG. 1) of the first embodiment in that filter outputs B1 of a plurality of filters 4 are output to an adder 5 as shown in FIG. 4. Note that in the sensor system 1a according to the second embodiment, the same components as those of the sensor system 1 of the first embodiment are denoted by the same reference numerals, and descriptions thereof are omitted.

(1) Configuration

As illustrated in FIG. 4, the sensor system 1a according to the second embodiment includes a sensor processing system 2a.

The plurality of filters 4 of the sensor processing system 2a correspond to a plurality of sensors 3 on a one-to-one basis and are each inserted into an output paths F1 of a corresponding one of the plurality of sensors 3 (path between each sensor 3 and the adder 5). Specifically, the plurality of filters 4 include a first filter 41, a second filter 42, and a third filter 43. A first filter 41 corresponds to a first sensor 31 and is inserted into a first output path F11 of the first sensor 31 (the path between the first sensor 31 and the adder 5). At the same time, the first filter 41 is inserted in a first path G11 of the first sensor 31 (the path between the first sensor 31 and a comparator 7). A second filter 42 corresponds to a second sensor 32 and is inserted in a second output path F12 of a second sensor 32 (the path between the second sensor 32 and the adder 5). At the same time, the second filter 42 is inserted in the second path G12 of the second sensor 32 (the path between the second sensor 32 and the comparator 7). A third filter 43 corresponds to a third sensor 33 and is inserted into a third output path F13 of the third sensor 33 (the path between the third sensor 33 and the adder 5). At the same time, the third filter 43 is inserted into a third path G13 of the third sensor 33 (the path between the third sensor 33 and the comparator 7).

The adder 5 of the second embodiment adds up the filter outputs B1 of the plurality of filters 4. Specifically, the adder 5 adds up a first filter output B11 of the first filter 41, a second filter output B12 of the second filter 42, and a third filter output B13 of the third filter 43.

The adder 5 outputs an addition result obtained by adding up the filter outputs B1 of the plurality of filters 4. For example, the adder 5 outputs the addition result to the control circuit 8. In the example of FIG. 4, the adder 5 outputs the addition result to the control circuit 8 via a divider 6.

Also in the second embodiment, as in the first embodiment, the adder 5 may have a function of setting individual contribution factors for the plurality of sensors 3. Specifically, the adder 5 may add up the filter outputs B1 of the plurality of filters 4 corresponding to the plurality of sensors 3 with the same contribution factor, or may add up the filter outputs B1 of the plurality of filters 4 corresponding to the plurality of sensors 3 with different contribution factors. This enables the influence of a filter output B1 of a filter 4 corresponding to an anomalous sensor 3 to be reduced in an addition output C1.

Since the adder 5 adds up the filter outputs B1 of the plurality of filters 4, the amplitude of the addition output C1 from the adder 5 differs depending on the number of filter outputs B1 input to the adder 5. As the number of the filter outputs B1 input to the adder 5 increases, the amplitude of the addition output C1 increases. If such an addition output C1 is input to the control circuit 8 as it is, the control circuit 8 may erroneously recognize the addition output C1. For this reason, the amplitude of an addition output D1 input to the control circuit 8 has to fall within a prescribed range regardless of the number of filter outputs B1 input to the adder 5.

Therefore, similarly to the first embodiment, the divider 6 reduces the amplitude of the addition output C1 of the adder 5 as illustrated in FIG. 4. Specifically, the gain of the divider 6 is, for example, the inverse number of the number of filter outputs B1 input to the adder 5. The divider 6 multiplies the amplitude of the addition output C1 by the inverse number of the number of filter outputs B1 input to the adder 5. For example, when three filter outputs B1 are input to the adder 5, the amplitude of the addition output C1 of the adder 5 is three times that in the case of inputting only one filter output to the adder 5. Therefore, the divider 6 divides the amplitude of the addition output C1 of the adder 5 by three. This enables the range of the addition output C1 to be a prescribed range regardless of the number of filter outputs B1 input to the adder 5. The addition output D1 amplified by the divider 6 is output to the control circuit 8.

Similarly to the first embodiment, the gain of the divider 6 is not limited to the inverse number of the number of sensor outputs A1 input to the adder 5 but may be other than the above-described example. In short, the gain of the divider 6 is set at least such that a change in the amplitude of the addition output D1 input to the control circuit 8 is small even if the number of sensor outputs A1 input to the adder 5 changes.

(2) Operation of Sensor Processing System

Normal operation (sensor process method) of the sensor processing system 2a according to the second embodiment will be described below by referring to FIG. 4.

First, each of the plurality of sensors 3 outputs a sensor output A1. Thereafter, the plurality of filters 4 individually reduce (remove) the low-frequency components of the sensor outputs A1 of the plurality of sensors 3. That is, each filter 4 reduces the low-frequency component of the sensor output A1 of a corresponding one of the sensors 3. Thereafter, the filter outputs B1 of the filters 4 are output to the adder 5.

The adder 5 adds up the filter outputs B1 of the plurality of filters 4. At this time, the adder 5 sets contribution factors to the filter outputs B1 of the respective filters 4 and then adds up the filter outputs B1 (outputs after the contribution factors are set) of the plurality of filters 4, and outputs the addition result (addition output C1). Thereafter, the divider 6 adjusts the amplitude of the addition output C1 of the adder 5. The divider 6 adjusts the amplitude of the addition output C1 such that the amplitude of the addition output D1 to be input to the control circuit 8 is substantially constant regardless of the number of filter outputs B1 input to the adder 5. Thereafter, the control circuit 8 obtains the addition output D1 adjusted by the divider 6.

Note that operation of determining anomalies (sensor process method) in the sensor processing system 2a according to the second embodiment is the same as that the sensor processing system 2 of the first embodiment, and therefore the explanation thereof is omitted.

(3) Effect

In the sensor processing system 2a according to the second embodiment, each of the plurality of filters 4 (reduction circuits) is inserted into the output path F1 of a corresponding one of the sensors 3. Thus, a result based on the filter output B1, (sensor output with reduced low-frequency components) can be output via the output path F1.

In the sensor processing system 2a according to the second embodiment, the adder 5 adds up the filter outputs B1 of the plurality of filters 4 (reduction circuits) and outputs the addition output C1. This makes it possible to detect a detection target by adding up the filter outputs B1 of the plurality of filters 4. As a result, it is easy to enhance fault detection accuracy of the sensor 3 and detection accuracy of the sensor 3 as compared to a case where the detection target is detected based on an output of one filter (reduction circuit).

In the sensor processing system 2a according to the second embodiment, the adder 5 sets individual contribution factors for the plurality of sensors 3. This enables the filter outputs B1 of plurality of filter 4 to be added up, for example, with a contribution factor for the anomalous sensor 3 being decreased. As a result, the fault detection accuracy of the sensor 3 and the detection accuracy of the sensor 3 can be further enhanced.

Variation

Variations of the first and second embodiments will be described below.

The number of sensors 3 is not limited to three but may be four or five. Alternatively, the number of sensors 3 may be two. In short, the sensor system 1 includes at least a plurality of sensors 3.

Similarly, the number of filters 4 is not limited to three but may be four or five. Alternatively, the number of filters 4 may be two. In short, the sensor processing system 2 includes at least a plurality of filters 4.

Figure 5:
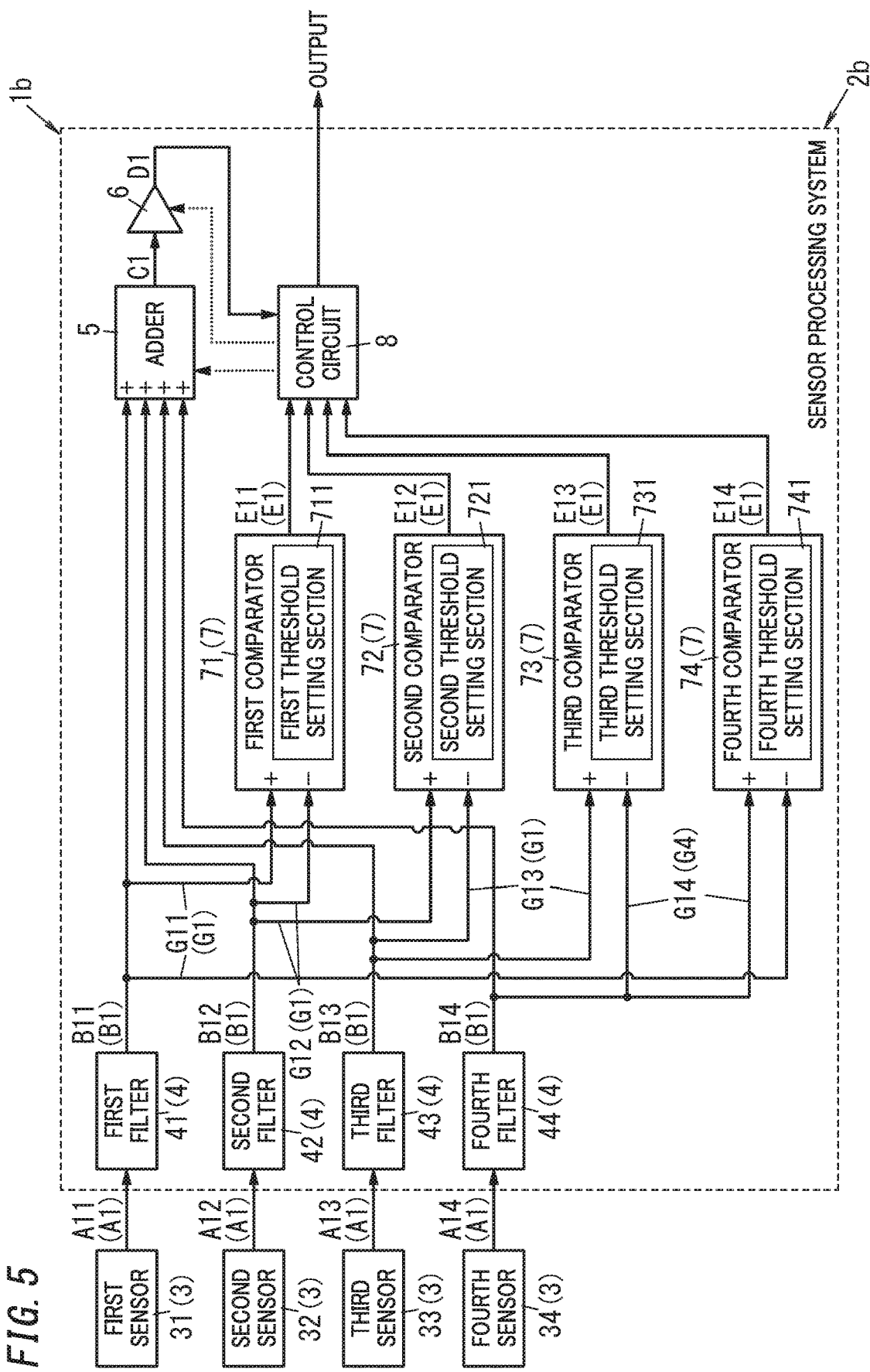
FIG. 5 is a block diagram illustrating a sensor system according to a variation of the second embodiment.

As illustrated in FIG. 5, a sensor system 1b according to a variation of the second embodiment includes a sensor processing system 2b and four sensors 3. The four sensors 3 include a first sensor 31, a second sensor 32, a third sensor 33, and a fourth sensor 34. The sensor processing system 2b includes four filters 4, an adder 5, a divider 6, four comparators 7, and a control circuit 8.

The four filters 4 correspond to the four sensors 3 on a one-to-one basis and are each inserted into an output path F1 of a corresponding one of the four sensors 3. A fourth filter 44 corresponds to the fourth sensor 34 and reduces (removes) a low-frequency component of a fourth sensor output A14 of the fourth sensor 34.

Each of the four comparators 7 compares the filter outputs B1 of two of the four filters 4. The four comparators 7 include a first comparator 71, a second comparator 72, a third comparator 73, and a fourth comparator 74.

The first comparator 71 compares the first filter output B11 of the first filter 41 and the second filter output B12 of the second filter 42 with each other. Then, the first comparator 71 outputs a comparison result between the first filter output B11 and the second filter output B12 as a first comparison result E11. The first comparator 71 has a first threshold setting section 711 for setting a first threshold.

The second comparator 72 compares the second filter output B12 of the second filter 42 and a third filter output B13 of a third filter 43 with each other. Then, the second comparator 72 outputs a comparison result between the second filter output B12 and the third filter output B13 as a second comparison result E12. The second comparator 72 has a second threshold setting section 721 for setting a second threshold.

The third comparator 73 compares the third filter output B13 of the third filter 43 and a fourth filter output B14 of a fourth filter 44 with each other. Then, the third comparator 73 outputs a comparison result between the third filter output B13 and the fourth filter output B14 as a third comparison result E13. The third comparator 73 has a third threshold setting section 731 for setting a third threshold.

The fourth comparator 74 compares a fourth filter output B14 of a fourth filter 44 and the first filter output B11 of the first filter 41 with each other. The fourth comparator 74 outputs a comparison result between the fourth filter output B14 and the first filter output B11 as a fourth comparison result E14. The fourth comparator 74 has a fourth threshold setting section 741 for setting a fourth threshold.

In short, comparing filter outputs B1 of N filters 4, that is, sensor outputs A1 of N sensors 3 enables an anomalous sensor 3 (broken sensor 3) to be specified. Moreover, even if one sensor 3 is broken, adding up sensor outputs A1 (filter outputs B1) of (N−1) sensors 3 except for the broken sensor 3 enables noise reduction effects of sensor outputs A1 to be continuously obtained.

Note that implementations of components of the sensor processing system 2, 2a, 2b and the plurality of sensors 3 are not limited. The components of the sensor processing system 2, 2a, 2b and the plurality of sensors 3 may be integrated on a silicon wafer. Alternatively, each of the plurality of sensors 3 may be mounted as a discrete element on a printed circuit board (PCB), and signal processing may be performed by a micro control unit (MCU).

The filter 4 may be a digital filter or an analog filter.

The sensor system and the sensor processing system 2b according to the variation also have the same effects as the sensor system 1 and the sensor processing system 2 according to the first embodiment, and the sensor system 1a and the sensor processing system 2a according to the second embodiment.

The embodiments and the variations described above are only part of various embodiments and variations of the present disclosure. Moreover, the embodiments and the variations may be modified in various ways depending on the designs and the like as long as object of the present disclosure can be achieved.

Aspects

The present specification discloses the following aspects.

A sensor processing system (2; 2a; 2b) of a first aspect includes a plurality of reduction circuits (filters 4). The plurality of reduction circuits correspond to a plurality of sensors (3) on a one-to-one basis. Each of the plurality of reduction circuits is electrically connected to an output terminal of a corresponding one of the plurality of sensors (3) to reduce a low-frequency component of a sensor output (A1) of the corresponding one of the plurality of sensors (3).

The sensor processing system (2; 2a; 2b) of the first aspect enables the low-frequency components of the sensor outputs (A1) of the plurality of sensors (3) to be individually reduced, and therefore, it is easy to enhance fault detection accuracy of the sensor (3) and detection accuracy of the sensor (3).

In a sensor processing system (2; 2a; 2b) of a second aspect referring to the first aspect, the plurality of sensors (3) are angular rate sensors.

According to the sensor processing system (2; 2a; 2b) of the second aspect, it is easy to enhance the detection accuracy with respect to the angular rate.

In a sensor processing system (2; 2a; 2b) of a third aspect referring to the first aspect, the plurality of sensors (3) are acceleration sensors.

According to the sensor processing system (2; 2a; 2b) of the third aspect, it is easy to enhance the detection accuracy with respect to the acceleration.

In a sensor processing system (2) according to a fourth aspect referring to anyone of the first to third aspects, each of the plurality of reduction circuits (filters 4) is branched from an output path (F1) of the corresponding one of the plurality of sensors (3).

According to the sensor processing system (2) of the fourth aspect, it is possible to output, via the output path (F1), a result based on the sensor outputs (A1), whose low-frequency components have not been reduced.

A sensor processing system (2) of a fifth aspect referring to the fourth aspect further includes an adder (5). The adder (5) is configured to add up sensor outputs (A1) of the plurality of sensors (3) to output an addition result (addition output C1).

The sensor processing system (2) referring to the fifth aspect makes it possible to detect a detection target by adding up sensor outputs (A1) of the plurality of sensors (3). As a result, it is easy to enhance fault detection accuracy of the sensor (3) and detection accuracy of the sensor (3) as compared with detecting a detection target by using one sensor output.

In a sensor processing system (2a; 2b) according to a sixth aspect referring to anyone of the first to third aspects, each of the plurality of reduction circuits (filters 4) is inserted in an output path (F1) of the corresponding one of the plurality of sensors (3).

According to the sensor processing system (2a; 2b) of the sixth aspect, it is possible to output, via the output path (F1), a result based on the sensor outputs (filter outputs B1), whose low-frequency components having been reduced.

A sensor processing system (2a; 2b) of a seventh aspect referring to the sixth aspect further includes an adder (5). The adder (5) is configured to add up outputs (filter outputs B1) of the plurality of reduction circuits (filters 4) to output an addition result (addition output C1).

The sensor processing system (2a; 2b) of the seventh aspect makes it possible to detect a detection target by adding up the outputs (filter outputs B1) of the plurality of reduction circuits (filters 4). As a result, it is easy to enhance fault detection accuracy of the sensor (3) and detection accuracy of the sensor (3) as compared to a case where a detection target is detected based on an output of one reduction circuit.

A sensor processing system (2; 2a; 2b) according to an eighth aspect referring to any one of the first to seventh aspects further includes a comparator (7) and a control circuit (8). The comparator (7) is configured to compare the outputs (filter outputs B1) of two reduction circuits of the plurality of reduction circuits (filters 4) with each other to output a comparison result (E1). The control circuit (8) is configured to determine, based on the comparison result (E1), whether or not the corresponding one of the plurality of sensors (3) is normal.

According to sensor processing system (2; 2a; 2b) according to the eighth aspect, the states of the sensors (3) can be determined by effectively utilizing the sensor outputs (A1) of the plurality of sensors (3).

In a sensor processing system (2; 2a; 2b) according to a ninth aspect referring to fifth or seventh aspect, the adder (5) is configured to set individual contribution factors for the plurality of sensors (3).

The sensor processing system (2; 2a; 2b) of the ninth aspect enables the sensor output (A1) of the plurality of sensors (3) or the outputs (filter outputs B1) of the plurality of reduction circuits (filters 4) to be added up, for example, with a contribution factor for the anomalous sensor (3) being decreased. As a result, the fault detection accuracy of the sensor (3) and the detection accuracy of the sensor (3) can be further enhanced.

A sensor processing system (2; 2a; 2b) of a tenth aspect referring to the ninth aspect further includes a comparator (7). The comparator (7) is configured to compare the outputs (filter outputs B1) of two reduction circuits of the plurality of reduction circuits (filters 4) with each other to output a comparison result (E1). The adder (5) is configured to decrease a contribution factor for an anomalous sensor (3) of the plurality of sensors (3) based on the comparison result (E1) by the comparator (7).

The sensor processing system (2; 2a; 2b) of the tenth aspect enables the sensor outputs (A1) of a plurality of sensors (3) or the outputs (filter outputs B1) of the plurality of reduction circuits (filters 4) to be added up with a contribution factor for the anomalous sensor (3) being decreased. As a result, the fault detection accuracy of the sensor (3) and the detection accuracy of the sensor (3) can be further enhanced.

In a sensor processing system (2; 2a; 2b) according to an eleventh aspect referring to any one of the first to tenth aspects, the plurality of reduction circuits (filters 4) include high-pass filters.

According to the sensor processing system (2; 2a; 2b) according to the eleventh aspect, the low-frequency components of the sensor outputs (A1) can be reliably reduced.

A sensor system (1; 1a; 1b) of a twelfth aspect includes the sensor processing system (2; 2a; 2b) of any one of the first to eleventh aspects and a plurality of sensors (3).

According to the sensor system (1; 1a; 1b) of the twelfth aspect, the low-frequency components of the sensor outputs (A1) of the plurality of sensors (3) can be individually reduced in the sensor processing system (2; 2a; 2b). As a result, it is easy to enhance fault detection accuracy of the sensor (3) and detection accuracy of the sensor (3).

A sensor process method according to a thirteenth aspect includes individually reducing the low-frequency components of sensor outputs (A1) of a plurality of sensors (3).

The sensor process method of the thirteenth aspect enables the low-frequency components of the sensor outputs (A1) of the plurality of sensors (3) to be individually reduced, and therefore, it is easy to enhance fault detection accuracy of the sensor (3) and detection accuracy of the sensor (3).

The invention claimed is:

1. A sensor processing system, comprising:
a plurality of reduction circuits,
the plurality of reduction circuits corresponding to a plurality of sensors on a one-to-one basis, each of the plurality of sensors measuring the same physical quantity,
each of the plurality of reduction circuits being directly connected to an output terminal of a corresponding one of the plurality of sensors to reduce a low-frequency component of a sensor output of the corresponding one of the plurality of sensors,
a comparator configured to receive, as an input signal, outputs of two reduction circuits of the plurality of reduction circuits, and compare the outputs of the two reduction circuits of the plurality of reduction circuits with each other to output a comparison result, the outputs of the two reduction circuits being directly connected to the comparator; and
a control circuit configured to determine, based on the comparison result, that is output from the comparator, whether or not the two sensors of the plurality of sensors corresponding to the two reduction circuits of the plurality of reduction circuits providing the input signals to the comparator are operating normally.

2. The sensor processing system of claim 1, wherein the plurality of sensors are angular rate sensors.

3. The sensor processing system of claim 1, wherein the plurality of sensors are acceleration sensors.

4. The sensor processing system of claim 1, wherein each of the plurality of reduction circuits is branched from an output path of the corresponding one of the plurality of sensors.

5. The sensor processing system of claim 4, further comprising an adder configured to add up sensor outputs of the plurality of sensors to output an addition result.

6. The sensor processing system of claim 1, wherein each of the plurality of reduction circuits is inserted in an output path of the corresponding one of the plurality of sensors.

7. The sensor processing system of claim 6, further comprising an adder configured to add up outputs of the plurality of reduction circuits to output an addition result.

8. The sensor processing system of claim 5, wherein the adder is configured to set individual contribution factors for the plurality of sensors.

9. The sensor processing system of claim 7, wherein the adder is configured to set individual contribution factors for the plurality of sensors.

10. A sensor system, comprising:
the sensor processing system of claim 1; and
the plurality of sensors.

11. The sensor processing system of claim 1, wherein each of the plurality of reduction circuits includes at least one of a high-pass filter or a band-pass filter.

12. The sensor processing system of claim 1, wherein low-frequency component of each of the outputs of the two reduction circuits being reduced.

13. A sensor processing system, comprising:
a plurality of reduction circuits,
the plurality of reduction circuits corresponding to a plurality of sensors on a one-to-one basis,
each of the plurality of reduction circuits being electrically connected to an output terminal of a corresponding one of the plurality of sensors to reduce a low-frequency component of a sensor output of the corresponding one of the plurality of sensors;
a comparator configured to receive, as an input signal, outputs of two reduction circuits of the plurality of reduction circuits, and compare the outputs of the two reduction circuits of the plurality of reduction circuits with each other to output a comparison result;
a control circuit configured to determine, based on the comparison result, whether or not the corresponding one of the plurality of sensors is normal; and
an adder configured to add up sensor outputs of the plurality of sensors to output an addition result, wherein
each of the plurality of reduction circuits is branched from an output path of the corresponding one of the plurality of sensors,
the adder is configured to set individual contribution factors for the plurality of sensors, and decrease a contribution factor for an anomalous sensor of the plurality of sensors based on the comparison result by the comparator.

* * * * *